(12) United States Patent
Davenport et al.

(10) Patent No.: US 6,310,509 B1
(45) Date of Patent: Oct. 30, 2001

(54) DIFFERENTIAL MULTIPLEXER WITH HIGH BANDWIDTH AND REDUCED CROSSTALK

(75) Inventors: William H. Davenport; Andy Turudic, both of Hillsboro, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 09/208,625

(22) Filed: Dec. 8, 1998

(51) Int. Cl.$^7$ ................................................ H03K 17/62
(52) U.S. Cl. ............................................ 327/407; 327/99
(58) Field of Search ............................... 327/99, 407–413, 327/403, 404

(56) References Cited

U.S. PATENT DOCUMENTS

| | | | |
|---|---|---|---|
| 5,045,804 | * | 9/1991 | Sugawara et al. ............ 327/411 |
| 6,137,340 | * | 10/2000 | Goodell et al. ............. 327/407 |
| 6,211,722 | * | 4/2001 | Mattia et al. .............. 327/407 |
| 6,239,646 | * | 5/2001 | Navabi et al. .............. 327/407 |

* cited by examiner

Primary Examiner—Toan Tran
(74) Attorney, Agent, or Firm—Skjerven Morrill MacPherson LLP; Christopher B. Allenby

(57) ABSTRACT

A multiplexer includes a first input device that receives a first input signal and a first select signal. When the first select signal has a first state, the first input device generates a first voltage at a first node in response to the first input signal. When the first select signal has a second state, the first input device generates a first reference voltage at the first node. A second input device receives a second input signal and a second select signal related to the first select signal. When the second select signal has a first state, the second input device generates a second voltage at a second node in response to the second input signal. When the second select signal has a second state, the second input device generates a second reference voltage at the second node. A first output buffer has an input terminal coupled to the first node and an output terminal coupled to an output node. The first output buffer tracks the first voltage at the output terminal, and presents a high impedance at the output terminal when the first reference voltage is present at the first node. A second output buffer has an input terminal coupled to the second node and an output terminal coupled to the output node. The second output buffer tracks the second voltage at the output terminal, and presents a high impedance at the output terminal when the second reference voltage is present at the second node.

10 Claims, 1 Drawing Sheet

DIFFERENTIAL MULTIPLEXER WITH HIGH BANDWIDTH AND REDUCED CROSSTALK

TECHNICAL FIELD OF THE INVENTION

The present invention relates to signal routing, and in particular to a differential multiplexer with high bandwidth and reduced crosstalk.

BACKGROUND OF THE INVENTION

In signal routing, multiplexing two or more signals is frequently desirable. In a typical multiplexer, two or more input signals and a select signal are received. The input signal indicated by the select signal is then buffered through to the output of the multiplexer.

In a multiplexer, it is desirable to reduce or eliminate the amount of crosstalk between input channels. It is also desirable, in high-speed signal routing applications, to maximize the output slew rate of the multiplexer in order to enable the multiplexer to maintain signal fidelity at the highest data rates.

SUMMARY OF THE INVENTION

Therefore, a need has arisen for a multiplexer that addresses the disadvantages and deficiencies of the prior art. In particular, a need has arisen for a multiplexer with high bandwidth and reduced crosstalk.

Accordingly, an improved multiplexer is disclosed. In one embodiment, the multiplexer includes a first input device that receives a first input signal and a first select signal. When the first select signal has a first state, the first input device generates a first voltage at a first node in response to the first input signal. When the first select signal has a second state, the first input device generates a first reference voltage at the first node. A second input device receives a second input signal and a second select signal related to the first select signal. When the second select signal has a first state, the second input device generates a second voltage at a second node in response to the second input signal. When the second select signal has a second state, the second input device generates a second reference voltage at the second node. A first output buffer has an input terminal coupled to the first node and an output terminal coupled to an output node. The first output buffer tracks the first voltage at the output terminal, and presents a high impedance at the output terminal when the first reference voltage is present at the first node. A second output buffer has an input terminal coupled to the second node and an output terminal coupled to the output node. The second output buffer tracks the second voltage at the output terminal, and presents a high impedance at the output terminal when the second reference voltage is present at the second node.

An advantage of the present invention is that the multiplexer inputs are isolated, reducing or eliminating crosstalk between input channels. Another advantage of the present invention is that internal slew rates are increased, thereby increasing the output slew rate of the multiplexer and maximizing the bandwidth capability of the multiplexer.

BRIEF DESCRIPTION OF THE DRAWING

For a more complete understanding of the present invention and for further features and advantages, reference is now made to the following description taken in conjunction with the accompanying drawing, in which.

DETAILED DESCRIPTION OF THE INVENTION

Figure 1:
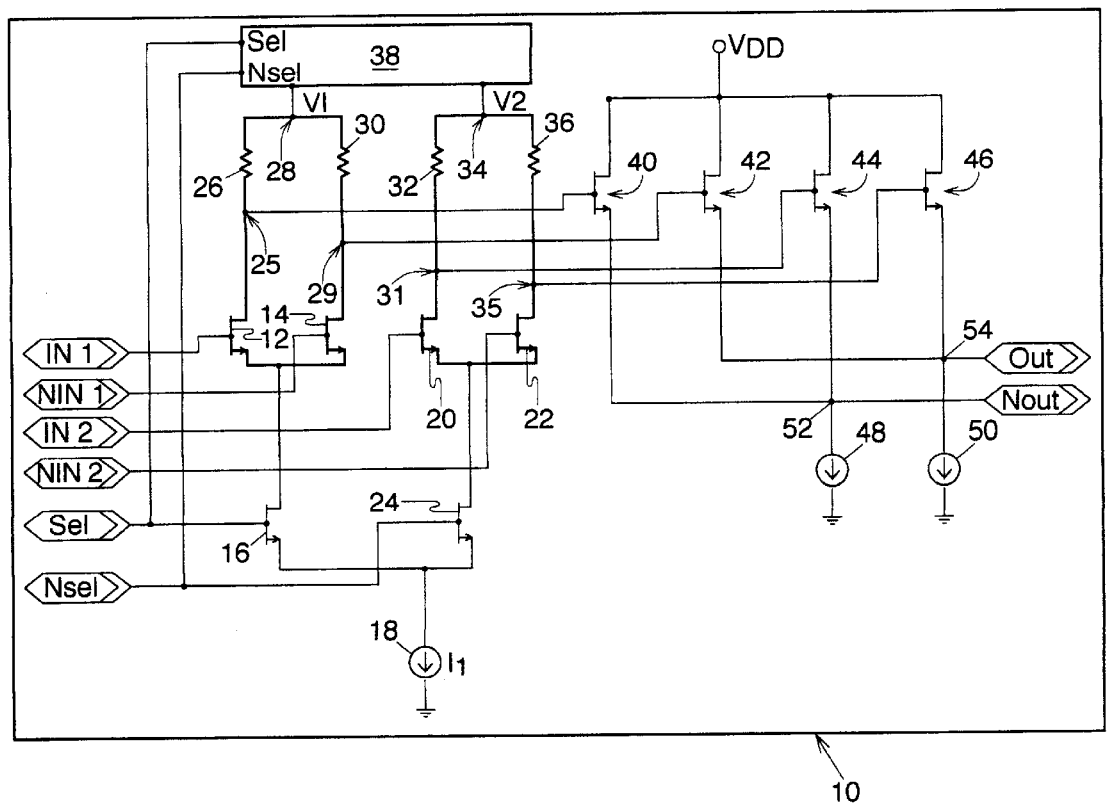
FIG. 1 is a schematic diagram of a differential multiplexer constructed in accordance with one embodiment of the present invention.

The preferred embodiments of the present invention and their advantages are best understood by referring to FIG. 1. In that FIGURE, a two-input differential multiplexer 10 is shown. Multiplexer 10 receives a first pair of complementary logic-level input signals IN1 and NIN1 and a second pair of complementary logic-level input signals IN2 and NIN2. Multiplexer 10 also receives complementary select signals SEL and NSEL to select either IN1 and NIN1 or IN2 and NIN2 as the signals to be driven to the output of multiplexer 10. While a two-input multiplexer is shown for ease of illustration, it will be understood that the invention may be implemented in a multiplexer with three or more inputs.

Input signals IN1 and NIN1 are supplied to the gates of transistors 12 and 14, respectively. Transistors 12 and 14 have coupled sources. Select signal SEL is supplied to the gate of a transistor or 16, which has a drain connected to the sources of transistors 12 and 14 and a source connected to a current source 18, which sources a current $I_1$. Thus, select signal SEL causes transistor 16 to create either an open circuit or a closed circuit between transistors 12 and 14 and current source 18.

Similarly, input signals IN2 and NIN2 are supplied to the gates of transistors 20 and 22, respectively. Transistors 20 and 22 have coupled sources. Complementary select signal NSEL is supplied to the gate of a transistor 24, which has a drain connected to the sources of transistors 20 and 22 and a source connected to current source 18. Thus, complementary select signal NSEL causes transistor 24 to create either an open circuit or a closed circuit between transistors 20 and 22 and current source 18.

Transistor 12 has a drain connected to a node 25. A resistor 26 having a resistance R is connected between node 25 and a voltage supply node 28, which carries a voltage V1. Similarly, transistor 14 has a drain connected to a node 29. A resistor 30 having a resistance R is connected between node 29 and voltage supply node 28. Thus, when select signal SEL is HIGH, one of the transistors 12 or 14 will conduct current $I_1$, while the other transistor 12 or 14 will conduct no current. As a result, either node 25 or node 29 will carry the supply voltage V1, while the other node 25 or 29 will carry a voltage equal to $V1-I_1*R$.

Likewise, transistor 20 has a drain connected to a node 31. A resistor 32 having a resistance R is connected between node 31 and a second voltage supply node 34, which carries a voltage V2. Transistor 22 has a drain connected to a node 35. A resistor 36 having a resistance R is connected between node 35 and voltage supply node 34. Thus, when complementary select signal NSEL is HIGH, one of the transistors 20 or 22 will conduct current $I_1$, while the other transistor 20 or 22 will conduct no current. As a result, either node 31 or node 35 will carry the supply voltage V2, while the other node 31 or 35 will carry a voltage equal to $V2-I_1*R$.

Supply voltages V1 and V2 are provided by a voltage supply 38, which receives select signals SEL and NSEL. Voltage supply 38 provides supply voltages V1 and V2 at different levels according depending on the select inputs SEL and NSEL, as will be described more fully below.

The voltages at nodes 25, 29, 31 and 35 are supplied to the gates of output transistors 40, 42, 44 and 46, respectively. Each output transistor 40, 42, 44 and 46 has a drain connected to a supply voltage $V_{DD}$ and a source connected to one of two current sources 48 and 50. Transistors 40 and 44, which receive their respective gate voltages from nodes 25 and 31, respectively, have sources connected to current source 48 via output node 52. Transistors 42 and 46, which receive their respective gate voltages from nodes 29 and 35, respectively, have sources connected to current source 50 via output node 54.

An output signal OUT is generated by transistors 42 and 46 and current source 50 at output node 54. A complementary output signal NOUT is generated by transistors 40 and 44 and current source 48 at output node 52.

In one embodiment, multiplexer 10 is an integrated circuit created on a GaAs substrate. In this embodiment, the transistor components of multiplexer 10 are GaAs n-channel MESFETs with a channel length of 0.6 microns. Exemplary transistor widths and other circuit component values and voltages are listed in Table A according to reference numeral.

TABLE A

| Transistor | Width (microns) |
| --- | --- |
| 12 | 15 |
| 14 | 15 |
| 16 | 15 |
| 20 | 15 |
| 22 | 15 |
| 24 | 15 |
| 40 | 12 |
| 42 | 12 |
| 44 | 12 |
| 46 | 12 |

| Voltage Supply | Voltage |
| --- | --- |
| V1 | 3.3 or 1.5 V |
| V2 | 3.3 or 1.5 V |
| $V_{DD}$ | 3.3 V |

| Resistor | Resistance (ohms) |
| --- | --- |
| 26 | 3.2k |
| 30 | 3.2k |
| 32 | 3.2k |
| 36 | 3.2k |

| Current Source | Current |
| --- | --- |
| 18 | 250 $\mu A$ |
| 48 | 220 $\mu A$ |
| 50 | 220 $\mu A$ |
| Signal | Levels |
| INx/NINx | 1.4/2.0 V |
| SEL/NSEL | 0.8/1.4 V |
| OUT/NOUT | 2.4/3.0 V |

The operation of multiplexer 10 will now be described. When select signal SEL is HIGH and NSEL is LOW, the current $I_1$ drawn by current source 18 is drawn entirely from the sources of transistors 12 and 14, while no current is conducted by transistors 20 and 22. In this state, input signals IN1 and NIN1 determine the values of output signals OUT and NOUT.

Thus, as previously stated, one of the transistors 12 or 14 will conduct current $I_1$, while the other transistor 12 or 14 will conduct no current. As a result, either node 25 or node 29 will carry the supply voltage V1, while the other node 25 or 29 will carry a voltage equal to $V1-I_1*R$. Because transistors 20 and 22 conduct no current, nodes 32 and 36 carry the supply voltage V2.

When select signal SEL is HIGH, voltage supply 38 provides voltage V1 at a higher value, such as 3.3 volts, and voltage V2 at a lower value, such as 1.5 volts. With V1 at 3.3 volts, and an IR voltage drop of approximately 0.7 to 0.8 volts across either resistor 26 or resistor 30, one of the nodes 25 or 29 carries a voltage of approximately 2.5 volts, while the other node 25 or 29 carries a voltage of 3.3 volts. Current sources 48 and 50 ensure that transistors 40 and 42 act as source-followers, thereby producing one output signal OUT or NOUT at 3.0 volts, and the other output signal at 2.4 volts. Thus, it may be seen that the lower supply voltage (in this example V2) of 1.5 volts maintains the gates of (in this example) transistors 44 and 46 at 1.5 volts, thereby ensuring that these transistors are off and allowing transistors 40 and 42 to act as source-followers without interference or contention from transistors 44 and 46.

When select signal SEL is LOW and NSEL is HIGH, it will be understood that the operation of multiplexer 10 is reversed, so that input signals IN2 and NIN2 determine the values of output signals OUT and NOUT. In this select state, either transistor 20 or 22 will conduct the current $I_1$ of current source 18. Voltage supply 38 generates supply voltage V1 at the lower value (e.g. 1.5 volts) and V2 at the higher value (e.g. 3.3 volts). Output transistors 44 and 46 will therefore act as source followers, while transistors 40 and 42 remain off.

From the foregoing description, it will be appreciated that multiplexer 10 has significant advantages over an alternative multiplexer design in which resistors 26 and 32 are one and the same resistor, resistors 30 and 36 are one and the same resistor, nodes 25 and 31 are one and the same node, nodes 29 and 35 are one and the same node, output transistors 40 and 44 are one and the same transistor, and output transistors 42 and 46 are one and the same transistor. In this alternative design, nodes 25 and 31 are effectively wire-ORed together, as are nodes 29 and 35. Although this alternative design functions in a manner similar to multiplexer 10, there are significant disadvantages associated with this design.

For example, the joined node 25/31 has two transistors 12 and 20 connected to it, thereby doubling the Miller capacitance (gate-drain capacitance) on the node. This added capacitance slows the voltage swing at node 25/31, decreasing the maximum frequency or bandwidth attainable by the multiplexer. This bandwidth-limiting problem increases proportionally as the number of signals multiplexed by the multiplexer increases. In addition, because input signals IN1, NIN1, IN2 and NIN2 may be live signals at all times regardless of the state of select signals SEL and NSEL, the Miller capacitance of transistors 12 and 20 creates capacitive coupling between the selected input signal and the non-selected input signal, thereby creating undesirable crosstalk.

In contrast, multiplexer 10 as shown in FIG. 1 has, in essence, wire-ORed outputs and isolated inputs. Thus, there is no crosstalk between the input signals at nodes 25, 29, 31 and 35. Furthermore, the capacitance on each node 25, 29, 31 and 35 is decreased, thereby increasing the attainable frequency or bandwidth of multiplexer 10.

On the output side, transistors 40 and 44, for example, are wire-ORed together at their sources. This doubles the amount of gate-source capacitance at output node 52. However, because output transistors 40 and 44 are designed to drive a relatively large load capacitance, the effect of the additional gate-source capacitance on the output slew rate at output node 52 is negligible. Furthermore, because either nodes 25 and 29 or nodes 31 and 35 are held at a constant voltage while inactive (i.e. not selected), the gate-source capacitance of the inactive output transistor 40 or 44 does not introduce any appreciable crosstalk into output signal NOUT.

The above-described advantages of multiplexer 10 are achieved without significantly increasing the power dissipation over that of the aforementioned alternative design. Thus, although multiplexer 10 has a somewhat greater number of circuit components than the aforementioned alternative design, the design of multiplexer 10 is advantageous is those applications where maximum bandwidth and/or minimum crosstalk is desired.

Although multiplexer 10 has been described herein as having GaAs MESFETs as its transistor components, it will be understood that multiplexer 10 may be implemented on a silicon substrate and/or with bipolar transistors or other switching devices. If bipolar transistors are used, it will be appreciated that multiplexer 10 may advantageously be implemented in an emitter coupled logic (ECL) circuit. Thus, in the appended claims, the phrase "first terminal," when used in connection with a transistor, shall refer to the base or gate terminal of the transistor. Similarly, the phrases "second terminal" and "third terminal," when used in connection with a transistor, shall refer to the collector, drain, emitter or source terminal of the transistor. Furthermore, in the appended claims, the phrase "coupled to" shall refer to any electrical connection between two elements, whether a direct connection or through intervening active or passive circuit components.

It will also be understood that the present invention may be implemented in a non-differential, inverting multiplexer. In this embodiment, signals, NIN1, NIN2 and OUT are eliminated, along with transistors 14, 22, 42 and 46, resistors 30 and 36 and current source 50. In this embodiment, signals SEL and NSEL, may both be used as previously described, or alternatively, signal NSEL may be eliminated and transistor 24 may be a p-channel transistor receiving select signal SEL at its gate. It will be appreciated that the advantageous aspects of multiplexer 10 are also exhibited by this alternative embodiment.

Although the present invention and its advantages have been described in detail, it should be understood that various changes, substitutions, and alterations can be made therein without departing from the spirit and scope of the invention as defined by the appended claims.

What is claimed is:

1. A multiplexer comprising:
    a first input device operable to receive a first input signal and a first select signal, the first input device being further operable, when the first select signal has a first state, to generate a first voltage at a first node in response to the first input signal, the first input device being further operable, when the first select signal has a second state, to generate a first reference voltage at the first node,
    a second input device operable to receive a second input signal and a second select signal related to the first select signal, the second input device being further operable, when the second select signal has a first state, to generate a second voltage at a second node in response to the second input signal, the second input device being further operable, when the second select signal has a second state, to generate a second reference voltage at the second node,
    a first output buffer having an input terminal coupled to the first node, the first output buffer having an output terminal coupled to an output node, the first output buffer being operable to track at the output terminal the first voltage, the first output buffer being operable to present a high impedance at the output terminal when the first reference voltage is present at the first node; and
    a second output buffer having an input terminal coupled to the second node, the second output buffer having an output terminal coupled to the output node, the second output buffer being operable to track at the output terminal the second voltage, the second output buffer being operable to present a high impedance at the output terminal when the second reference voltage is present at the second node.

2. The multiplexer of claim 1, wherein the first input device comprises:
    a first input node operable to receive the first input signal;
    a first input transistor having a first terminal coupled to the first input node;
    a first voltage supply node carrying a first reference voltage;
    a first impedance connected between the first voltage supply node and a second terminal of the first input transistor; and
    a current source coupled to a third terminal of the first input transistor.

3. The multiplexer of claim 2, wherein the second input device comprises:
    a second input node operable to receive the second input signal;
    a second input transistor having a first terminal coupled to the second input node, the second input transistor having a third terminal coupled to the current source;
    a second voltage supply node carrying a second reference voltage; and
    a second impedance connected between the second voltage supply node and a second terminal of the second input transistor.

4. The multiplexer of claim 3, wherein the first input device further comprises a first select transistor having a first terminal operable to receive the first select signal, the first select transistor further having a second terminal connected to the third terminal of the first input transistor, the first select transistor further having a third terminal connected to the current source.

5. The multiplexer of claim 4, wherein the second input device further comprises a second select transistor having a first terminal operable to receive the second select signal, the second select transistor further having a second terminal connected to the third terminal of the second input transistor, the second select transistor further having a third terminal connected to the current source.

6. The multiplexer of claim 1, wherein the first output buffer comprises a first output transistor having a first terminal coupled to the first node, a second terminal coupled to a reference voltage source, and a third terminal coupled to the output node.

7. The multiplexer of claim 6, wherein the second output buffer comprises a second output transistor having a first terminal coupled to the second node, a second terminal coupled to the reference voltage source, and a third terminal coupled to the output node.

8. The multiplexer of claim 3, further comprising a voltage supply operable to receive the first and second select signals, the voltage supply being operable to generate the first reference voltage at a first level and the second reference voltage at a second level in response to the first state of the first select signal and the second state of the second select signal, the voltage supply being operable to generate the first reference voltage at the second level and the second reference voltage at the first level in response to the second state of the first select signal and the first state of the second select signal.

9. A multiplexer comprising:

a first input node operable to receive a first input signal;

a second input node operable to receive a second input signal;

a first input transistor having a first terminal coupled to the first input node;

a second input transistor having a first terminal coupled to the second input node;

a first voltage supply node carrying a first reference voltage;

a second voltage supply node carrying a second reference voltage;

a first resistor connected between the first voltage supply node and a second terminal of the first input transistor;

a second resistor connected between the second voltage supply node and a second terminal of the second input transistor;

a current source;

a first select transistor having a first terminal operable to receive a first select signal, the first select transistor further having a second terminal coupled to a third terminal of the first input transistor, the first select transistor further having a third terminal coupled to the current source;

a second select transistor having a first terminal operable to receive a second select signal related to the first select signal, the second select transistor further having a second terminal coupled to a third terminal of the second input transistor, the second select transistor further having a third terminal coupled to the current source;

an output node;

a first output transistor having a first terminal coupled to the second terminal of the first input transistor, the first output transistor having a third terminal coupled to the output node, the first output transistor being operable to generate a voltage at the third terminal of the first output transistor in response to a voltage received at the first terminal of the first output transistor when the voltage received at the first terminal of the first output transistor is within a first range, the first output transistor being operable to present a high impedance at the third terminal of the first output transistor when the voltage received at the first terminal of the first output transistor is within a second range; and a second output transistor having a first terminal coupled to the second terminal of the second input transistor, the second output transistor having a third terminal coupled to the third terminal of the first output transistor, the second output transistor being operable to generate a voltage at the third terminal of the second output transistor in response to a voltage received at the first terminal of the second output transistor when the voltage received at the first terminal of the second output transistor is within a third range, the second output transistor being operable to present a high impedance at the third terminal of the second output transistor when the voltage received at the first terminal of the second output transistor is within a fourth range.

10. The multiplexer of claim 9, further comprising a voltage supply operable to receive the first and second select signals, the voltage supply being operable to generate the first reference voltage at a first level and the second reference voltage at a second level lower than the first level in response to the first state of the first select signal and the second state of the second select signal, the voltage supply being operable to generate the first reference voltage at the second level and the second reference voltage at the first level in response to the second state of the first select signal and the first state of the second select signal.

* * * * *